(12) United States Patent
Whittaker et al.

(10) Patent No.: US 10,419,042 B2
(45) Date of Patent: Sep. 17, 2019

(54) REDUCING POWER AMPLIFIER GAIN DRIFT DURING A DATA BURST

(71) Applicant: Skyworks Solutions, Inc., Woburn, MA (US)

(72) Inventors: Edward John Wemyss Whittaker, Bishop's Stortford (GB); Gordon Glen Rabjohn, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/000,048

(22) Filed: Jun. 5, 2018

(65) Prior Publication Data

US 2018/0351586 A1 Dec. 6, 2018

Related U.S. Application Data

(63) Continuation of application No. 15/390,928, filed on Dec. 27, 2016, now Pat. No. 10,014,886.
(60) Provisional application No. 62/272,929, filed on Dec. 30, 2015.

(51) Int. Cl.
| | |
|---|---|
| H03F 3/04 | (2006.01) |
| H04B 1/04 | (2006.01) |
| H03F 1/02 | (2006.01) |
| H03F 1/30 | (2006.01) |
| H03F 1/56 | (2006.01) |
| H03F 3/195 | (2006.01) |
| H03F 3/24 | (2006.01) |
| H03F 3/72 | (2006.01) |

(Continued)

(52) U.S. Cl.
CPC ............. *H04B 1/04* (2013.01); *H03F 1/0261* (2013.01); *H03F 1/301* (2013.01); *H03F 1/56* (2013.01); *H03F 3/193* (2013.01); *H03F 3/195* (2013.01); *H03F 3/245* (2013.01); *H03F 3/72* (2013.01); *H03G 3/3047* (2013.01); *H03F 2200/27* (2013.01); *H03F 2200/387* (2013.01); *H03F 2200/408* (2013.01); *H03F 2200/447* (2013.01); *H03F 2200/451* (2013.01); *H03F 2203/7227* (2013.01)

(58) Field of Classification Search
CPC .................. H03F 2200/447; H03G 3/3047
USPC .................................... 330/285, 289
See application file for complete search history.

(56) References Cited

U.S. PATENT DOCUMENTS

| | | |
|---|---|---|
| 5,396,163 A | 3/1995 | Nor et al. |
| 5,854,971 A | 12/1998 | Nagoya et al. |
| 5,977,826 A | 11/1999 | Behan et al. |

(Continued)

*Primary Examiner* — Steven J Mottola
(74) *Attorney, Agent, or Firm* — Knobbe Martens Olson & Bear LLP

(57) ABSTRACT

A bias circuit provides additional bias current for power amplifiers during data bursts to compensate for the gain droop caused by a rise in the power amplifier temperature during the data burst. A bias circuit includes a difference amplifier and switches coupled to the difference amplifier. The switches operate the bias circuit in a first mode when a transmit data burst is detected and operate the bias circuit in a second mode after the bias circuit has operated in the first mode for a predetermined period of time. In the first mode, the bias circuit charges a storage capacitor and sets an output current to zero. In the second mode, the bias circuit outputs the output current that increases above the initial value of zero as the PA warms up, where the excursion of this increase of current is determined by a register. The switches disable the bias circuit when the transmit data burst ends.

20 Claims, 13 Drawing Sheets

(51) Int. Cl.
*H03F 3/193* (2006.01)
*H03G 3/30* (2006.01)

(56) References Cited

U.S. PATENT DOCUMENTS

| | | |
|---|---|---|
| 7,026,874 B2 | 4/2006 | Vaara et al. |
| 7,898,316 B2 | 3/2011 | Pahr et al. |
| 9,405,332 B2 | 8/2016 | Ichitsubo |
| 10,014,886 B2 | 7/2018 | Whittaker et al. |
| 2002/0130786 A1 | 9/2002 | Weindorf |
| 2016/0273959 A1 | 9/2016 | Wang |
| 2017/0019076 A1 | 1/2017 | Ripley et al. |
| 2017/0194916 A1 | 7/2017 | Whittaker et al. |
| 2018/0115287 A1 | 4/2018 | Rabjohn et al. |

REDUCING POWER AMPLIFIER GAIN DRIFT DURING A DATA BURST

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Embodiments related to gain drift correction for power amplifiers, and in particular to managing bias compensation in power amplifiers during data bursts.

SUMMARY

By measuring the temperature of the power amplifier over a portion of the length of a burst, a temperature compensation circuit can adjust the gain of the power amplifier to compensate for the gain change due to thermal effects. The temperature of the power amplifier during the burst can be measured, for example, using an on-chip temperature sensor such as a diode on a power amplifier die.

Temperature can be sampled at or near a beginning of a burst. For example, a diode on a power amplifier die can sense a change in temperature. The output of the diode can be sampled about 3 us into the burst, for example. A sampling circuit, such as a circuit including a sample-and-hold circuit or a digital memory element, can save the sampled value. During the rest of the burst, a bias control circuit can control the current (therefore the gain) of one or more stages of the power amplifier to cancel the gain change caused by thermal effects. Alternatively or additionally, a bias control circuit can control a variable attenuator in the amplifier chain of a power amplifier to cancel the gain change caused by thermal effects.

Aspects of this disclosure relate to adjusting gain of a power amplifier to compensate variations in gain caused by thermal effects in a pulsed power amplifier configured to transmit relatively long bursts (e.g., bursts lasting at least 1 ms). A temperature compensation circuit can provide a compensation signal that is based on an indication of power amplifier temperature and a temperature coefficient. For instance, a computation circuit can multiply an indication of power amplifier temperature from a sampling circuit by the temperature coefficient. The gain of the power amplifier can be adjusted based on the compensation signal so as to compensate for thermal effects associate with transmitting relatively long bursts. For example, a bias signal provided to a power amplifier can be adjusted so as to adjust the gain of the power amplifier.

Embodiments disclose a bias circuit that provides additional bias current for power amplifiers during data bursts to compensate for the gain droop caused by a rise in the power amplifier temperature during the data burst. In an embodiment, a bias circuit includes a difference amplifier and switches coupled to the difference amplifier. The switches operate the bias circuit in a first mode when a transmit data burst is detected and operate the bias circuit in a second mode after the bias circuit has operated in the first mode for a predetermined period of time. In the first mode, the bias circuit charges a storage capacitor and sets an output current to zero. In the second mode, the bias circuit outputs a current that is related to the difference between the capacitor voltage (that represents the initial temperature, from a temperature sensing element on the amplifier) and the temperature of the amplifier (from the temperature sensing element on the amplifier). The switches disable the bias circuit when the transmit data burst ends.

According to some implementations, a method and device is disclosed for providing super-PTAT bias without using super-PTAT bias sources. This is accomplished by adjusting the bias by a few percentage points during the data burst in order to achieve a local super-PTAT characteristic.

According to a number of embodiments, the disclosure relates to a power amplifier system comprising a power amplifier configured to amplify a radio frequency signal that includes a transmit data burst, a temperature sensor configured to provide an indication of temperature of the power amplifier, and a bias circuit configured to detect a change in the temperature of the power amplifier based on the indication of the temperature during the transmit data burst, the bias circuit further configured to generate a bias compensation signal based on an indication of the change in the temperature of the power amplifier and a temperature coefficient.

In an embodiment, the bias compensation signal causes a gain of the power amplifier to be adjusted. In another embodiment, the bias circuit includes a sampling circuit configured to charge a storage capacitor for a period of time when the transmit data burst is detected and to provide the indication of the change in the temperature of the power amplifier over the duration of the time that the amplifier is on. In a further embodiment, the bias circuit includes a coefficient register configured to provide the temperature coefficient and a scaling circuit configured to multiply the indication of the change in the temperature of the power amplifier by the temperature coefficient to generate the bias compensation signal. In a yet further embodiment, the transmit data burst is at least 1 millisecond. In another embodiment, the transmit data burst is between 1 millisecond and 5 milliseconds.

In an embodiment, an output current of the bias circuit increases as the temperature of the power amplifier increases during the transmit data burst. In a further embodiment, the power amplifier and the temperature sensor are implemented on a gallium arsenide die and the bias circuit is implemented on a complementary metal-oxide semiconductor die. In a yet further embodiment, the power amplifier system is configured to operate within a wireless local area network.

Certain embodiments relate to a method of adjusting a gain of a power amplifier. The method comprises detecting a transmit data burst; measuring a temperature of the power amplifier during the transmit data burst; providing an indication of a change in the temperature of the power amplifier during the transmit data burst; generating a bias compensation signal based on the indication of the change in the temperature of the power amplifier and a temperature coefficient; and adjusting the gain of the power amplifier based on the bias compensation signal.

In an embodiment, the method further comprises sampling an indication of the temperature of the power amplifier for a first time interval after the transmit data burst is detected, providing the indication of the change in the temperature of the power amplifier during a second time interval of the transmit data burst that begins after the first time interval has ended, multiplying the indication of the change in the temperature of the power amplifier by the temperature coefficient, and using this signal to modify the gain of the amplifier; and disabling circuitry generating the bias compensation signal when the transmit data burst has ended.

According to a number of embodiments, the disclosure relates to a wireless communication device comprising a power amplifier configured to provide an amplified radio frequency signal; an antenna configured to transmit the amplified radio frequency signal; a temperature sensor configured to provide an indication of a temperature of the power amplifier; and a bias circuit configured to generate a bias signal to compensate for a change in a gain of the power amplifier during a transmit data burst by detecting a change in the temperature of the power amplifier based on the indication of temperature during the transmit data burst and multiplying an indication of the change in the temperature by a temperature coefficient.

In an embodiment, the bias circuit includes a sampling circuit configured to sample the indication of the temperature of the power amplifier for a first time interval after the transmit data burst is detected and to provide an indication of the change in the temperature of the power amplifier during a second time interval of the transmit data burst that begins after the first time interval has ended. In another embodiment, the bias circuit includes a register configured to provide the temperature coefficient and a scaling circuit configured to multiply the indication of the change in the temperature of the power amplifier by the temperature coefficient. In a further embodiment, the transmit data burst is between and including 1 millisecond and 5 milliseconds. In one embodiment, the transmit data burst is less than 1 millisecond. In another embodiment, the transmit data burst is greater than 5 milliseconds. In a yet further embodiment, the wireless communication device is configured as a mobile phone.

According to an embodiment, a bias circuit comprises a difference amplifier, and a set of switches coupled to the difference amplifier, where the set of switches are configured to operate the bias circuit in a first mode when a transmit data burst is detected whereby a storage capacitor is charged in the first mode and an output current of the bias circuit is set to zero in the first mode, and operate the bias circuit in a second mode when a predetermined time period of operation in the first mode has elapsed whereby the output current of the bias circuit is greater than zero in the second mode.

In an embodiment, the output current of the bias circuit is coupled to another bias circuit associated with a power amplifier. In another embodiment, the output current of the bias circuit in the second mode increases as the temperature of the power amplifier increases during the transmit data burst. In a yet further embodiment, the set of switches are configured to disable the bias circuit when the transmit data burst ends. In an embodiment, the transmit data burst includes a quadrature amplitude modulation (QAM) transmit data burst associated with an 802.11 wireless local area network (WLAN) standard, of which wireless fidelity (Wi-Fi) is an example.

According to another embodiment, a method comprises detecting a transmit data burst, operating a bias circuitry in a first mode for a predetermined time period in response to detecting the transmit data burst, and operating the bias circuitry in a second mode when the predetermined time period of operation in the first mode has elapsed.

In an embodiment, the method further comprises disabling the bias circuitry according to a determination that the transmit data burst has ended. In another embodiment, a storage capacitor is charged in the first mode and an output current of the bias circuit is set to zero in the first mode. In a further embodiment, the output current of the bias circuit is greater than zero in the second mode. In a further embodiment, the output current of the bias circuit is coupled to another bias circuit associated with a power amplifier. In a yet further embodiment, the output current of the bias circuit in the second mode increases as the temperature of the power amplifier increases during the transmit data burst.

According to a further embodiment, a module comprises a packaging substrate configured to receive a plurality of components, a power amplifier, and a bias circuit including a difference amplifier and a set of switches coupled to the difference amplifier, where the set of switches are configured to operate the bias circuit in a first mode when a transmit data burst is detected whereby a storage capacitor is charged in the first mode and an output current of the bias circuit is set to zero in the first mode, and operate the bias circuit in a second mode when a predetermined time period of operation in the first mode has elapsed whereby the output current of the bias circuit is greater than zero in the second mode.

In an embodiment, the module further comprises another bias circuitry associated with the power amplifier. In another embodiment, the output current of the bias circuit is coupled to the other bias circuit associated with the power amplifier. In a further embodiment, the output current of the bias circuit in the second mode increases as the temperature of the power amplifier increases during the transmit data burst. In an embodiment, the set of switches is configured to disable the bias circuit when the transmit data burst ends. In another embodiment, the transmit data burst includes a quadrature amplitude modulation (QAM) transmit data burst associated with an 802.11 wireless local area network (WLAN) standard, of which wireless fidelity (Wi-Fi) is an example.

According to a yet further embodiment, a radio frequency (RF) device comprises a transceiver configured to process RF signals, a power amplifier coupled to the transceiver, the power amplifier configured to generate an amplified RF signal, an antenna in communication with the transceiver, the antenna is configured to facilitate transmission of the amplified RF signal, and a bias circuit including a difference amplifier, and a set of switches coupled to the difference amplifier, where the set of switches is configured to operate the bias circuit in a first mode when a transmit data burst is detected whereby a storage capacitor is charged in the first mode and an output current of the bias circuit is set to zero in the first mode, and to operate the bias circuit in a second mode when a predetermined time period of operation in the first mode has elapsed whereby the output current of the bias circuit is greater than zero in the second mode.

In an embodiment, the RF device includes a wireless device. In another embodiment, the wireless device includes at least one of a base station, a router, a repeater, a cellular phone, a smartphone, a computer, a laptop, a tablet computer, and a peripheral device. In a further embodiment, the output current of the bias circuit is coupled to another bias circuit associated with the power amplifier. In a yet further embodiment, the output current of the bias circuit in the second mode increases as the temperature of the power amplifier increases during the transmit data burst.

In another embodiment, the set of switches configured to disable the bias circuit when the transmit data burst ends. In a further embodiment, the transmit data burst includes a quadrature amplitude modulation (QAM) transmit data burst associated with 802.11 wireless fidelity (Wi-Fi) operation of the transceiver.

BRIEF DESCRIPTION OF THE DRAWINGS

Embodiments of this disclosure will be described, by way of non-limiting example, with reference to the accompanying drawings.

DETAILED DESCRIPTION

Figure 1:
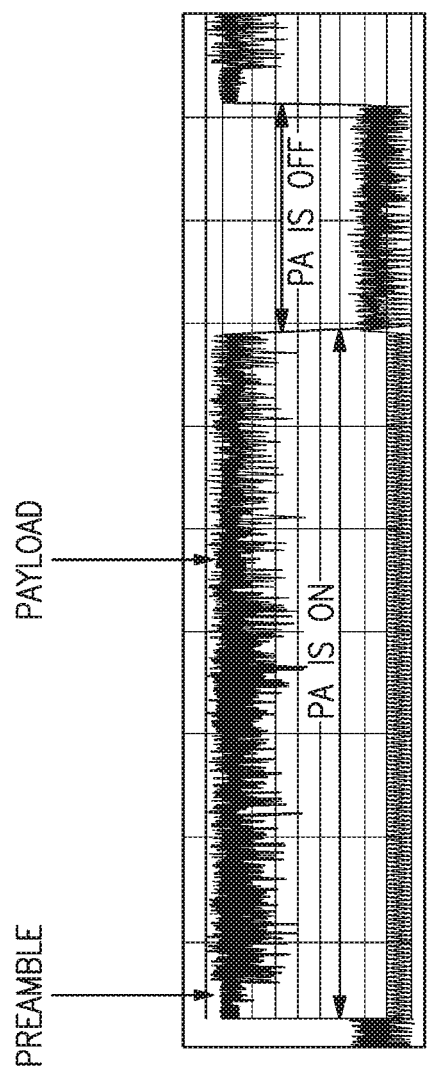
FIG. 1 is a graph that illustrates an example 802.11a transmission burst of a power amplifier.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The wireless local area network (WLAN) 802.11 standard, of which Wi-Fi is an example, specifies that the gain of a power amplifier (PA) is to remain stable during a quadrature amplitude modulation (QAM) transmit burst. This requirement arises since the receiver is only required by the standard to calibrate the amplitude of the burst at the start of the burst. In other words, there is no amplitude tracking requirement. The advent of the 256QAM 802.11ac MCS9 standard (and the future 1024 QAM MCS10 standard which is even more stringent) combined with extended data bursts up to 4 ms in duration causes the gain stability requirements of the PA to tighten further and, hence, become even more difficult to achieve. This is particularly the case with higher power PAs or where the PA is running at a high power density. In some situations, the problem has been identified as being thermal and is a consequence of the constraints on the biasing of the PA put in place to achieve very low distortion performance. Optimal biasing solutions that allow the PA to operate over a wide temperature range with high linearity tend to give a gain characteristic to the PA which decreases with increasing PA temperature.

Cellular power amplifiers can work on modulation schemes in which Error Vector Magnitude (EVM) tends not to be a significant problem and/or these power amplifiers have amplitude tracking throughout a burst (e.g., in Long Term Evolution). WLAN standards (802.11XX standards) typically assume a link is stationary and also assume a stable power over time. Some WLAN systems only used short bursts (e.g., bursts of around 200 us). Customers are demanding higher throughput. Newer standards allow for longer bursts. Frame aggregation allows multiple frames to be combined, which improves throughput. A relatively new WLAN Standard, 802.11AC, supports 256QAM, which has tighter EVM specifications. Accordingly, there is a desire to keep the gain of a power amplifier constant within a window of less than 0.2 dB over a 4 millisecond (ms) burst, over all conditions. The performance of the transmit chain is therefore becoming more difficult to achieve with more aggressive EVM requirements (from 3% EVM in 802.11A systems, to 1% EVM in 802.11AC), longer bursts, (e.g., going from 200 us to up to 4000 us), and increased bandwidth (e.g., going from 20 MHz to 160 MHz).

FIG. 1 is a graph that illustrates an example 802.11a transmission burst of a power amplifier. WLAN or Wi-Fi standards use bursts of information, or packets. A demodulation level is set at the beginning of the packet. As shown in FIG. 1, a preamble or header is provided at a beginning of a burst. The preamble can be in a range from about 16 us to 60 us long, for example. During the preamble, a level of demodulation is set. During the remaining time the power amplifier is on, the power amplifier transmits a payload that includes data. It is desirable to keep power substantially constant during the payload. After a burst that includes the preamble and the payload, the power amplifier is turned off. The power amplifier can subsequently be turned on and transmit a preamble and a payload in the next burst.

Since the level of modulation is set during the preamble of the burst, any change in system gain over the length of the packet can cause an increase in Error Vector Magnitude (EVM), and ultimately errors. EVM is a measure of the accuracy of a signal. Dynamic Error Vector Magnitude (DEVM) is a measure of EVM of a system that is turned on and turned off with bursts. The dominant cause of DEVM degradation can be the change in amplifier gain over the length of a burst. Since a typical WLAN or Wi-Fi power amplifier should be powered off between packets to save power, the WLAN or Wi-Fi power amplifier can still be warming up during transmission of a packet and the gain of the WLAN or Wi-Fi power amplifier can consequently drift. This drifting gain can impair DEVM. Aspects of this disclosure can reduce drift in power amplifier gain caused by thermal effects.

Power amplifiers that include bipolar transistors can also include a current mirror bias circuit. In this situation, the power amplifier current (and therefore the gain) at the beginning of a burst tends to be lower. This can be due to a reference transistor of the current mirror dissipating less power and being smaller than a power amplifier transistor, resulting in a lower steady state temperature of the reference transistor than the power amplifier transistor. While the power amplifier is warming up, such a difference in temperature between the reference transistor and the power amplifier transistor is changing.

Figure 2:
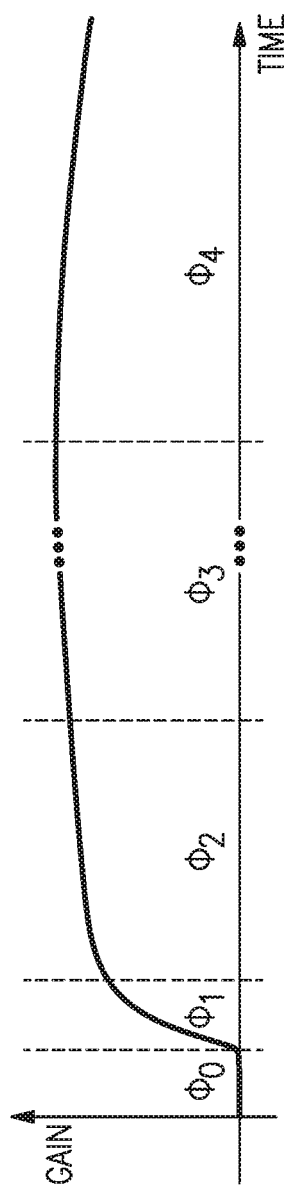
FIG. 2 is a graph of an example of power amplifier gain versus time.

FIG. 2 is a graph of an example of power amplifier gain versus time. The graph includes an initial phase $\Phi_0$, in which the power amplifier is disabled and has a low gain, such as a gain of about 0. After the initial phase $\Phi_0$, the power amplifier is enabled. For example, the end of the initial phase $\Phi_0$ can correspond to a time instance when an enable signal for the power amplifier transitions from a deactivated state to an activated state. As shown in FIG. 2, after being enabled, the power amplifier can operate in multiple phases associated with different gains. For example, the power amplifier can include a first phase $\Phi_1$, in which the power amplifier's gain can begin to settle based on a dominant influencing factor. Additionally, the power amplifier can include a second phase $\Phi_2$ in which gain can further settle based on one or more non-dominant influencing factors. The second phase $\Phi_2$ can last for around 10 s of microseconds, for example. Furthermore, in a third phase $\Phi_3$, the power amplifier's gain can be settled and substantially constant. The third phase $\Phi_3$ can last for 100 s of microseconds, such as around 300 microseconds to 700 microseconds, for example. In a fourth phase $\Phi_4$, the gain of the power amplifier can droop. This gain droop can occur in a relatively long burst. The graph of FIG. 2 illustrates example phases and may not be to scale. For instance, the fourth phase $\Phi_4$ can begin at around 500 us, around 800 us, or more into the burst. The fourth phase $\Phi_4$ can be several milliseconds, for example.

In certain applications, a power amplifier can provide amplification after the gain has settled and the gain has begun to droop. For example, the power amplifier may provide amplification during the fourth phase $\Phi_4$ for a relatively long burst (e.g., 1 millisecond or longer).

One approach to reduce DEVM in WLAN or Wi-Fi power amplifiers relates to using resistor-capacitor (R-C) networks to force more current into a current mirror of a biasing circuit for the first part of the burst to overcome the gain shortfall. Another approach is to force the reference transistor in the current mirror to track the power amplifier transistor temperature by adding a thermal path between the power amplifier transistor and the reference transistor and/or by running the reference transistor at a higher voltage or current than the power amplifier transistor. These techniques are typically effective for earlier WLAN/Wi-Fi standards (such as for 802.11A or 802.11G) where burst lengths were generally less than about 300 us and relatively simple forms of modulation (e.g., 64 QAM) that involved moderate DEVM (~30 dB EVM in the power) were used. These techniques can address the errors in phase 1 and 2 However, longer bursts (e.g., up to 5 milliseconds) and/or higher order modulation schemes (e.g., 256QAM and 1028QAM) with better DEVM specifications (e.g., about –35 dB or –42 dB EVM) can encounter problems with such approaches. Furthermore, such approaches have encountered some performance variation over a wide range of operating temperatures.

Yet another approach related to Proportional to Absolute Temperature (PTAT) source biasing. Such an approach can make gain constant over temperature, but the power amplifier can be over-biased and not linear at higher temperatures and also under-biased and not linear at lower temperatures.

One previous solution to this problem includes oversizing the PA so that the change in temperature during the burst is reduced. This solution, however, is unsatisfactory as it is expensive in terms of die area.

Another previous solution to this problem includes biasing the PA so the gain change with temperature is minimized. This is typically accomplished by using bias currents which rise steeply with increasing temperature. While this may be satisfactory for the first stage of a PA, subsequent stages (where the signal levels are much larger) tend to distort if the bias is changed significantly from its optimum value. The optimum bias for low distortion is usually a constant current which confers a decreasing gain with temperature characteristic to the PA. Thus, a PA with a bias which rises steeply with temperature works satisfactorily over a fairly limited temperature range.

According to some implementations, super-PTAT current bias to all stages flattens the gain versus temperature curve and eliminates gain drift with temperature. However, in turn, the PA is starved of current at low temperatures, which causes significant static EVM. Moreover, the PA is over-biased at high temperatures. As such, the PA cannot tolerate the large bias changes from –40 to 100° C. produced by super-PTAT biasing because of static EVM degradation at the temperature extremes.

As such, what is needed to be done is to keep the PA gain stable while the temperature of the PA changes during a data burst. During this data burst, the temperature change is relatively small, for example, an approximately 10° C. change for a 4 ms burst. In some situations, the requirement on gain stability of the PA over all of the operating temperatures is not nearly as tight since this is managed by closed loop power control from the transceiver. So, a solution which keeps the gain constant over all temperatures is not required.

The gain of a power amplifier can change as the power amplifier heats up. A gain droop can be caused by the change in temperature of the power amplifier as it warms up. This leads to poor dynamic error vector magnitude (DEVM) when amplitude tracking is off even though static EVM remains tolerable. In some situations, the gain droop is worse with constant current biased PAs and marginally better with proportional-to-absolute-temperature (PTAT) biased PAs. In some situations, the gain droop is also worse with increased supply voltages. In some situations, the gain droop is also worse with lower duty cycles.

Figure 3:
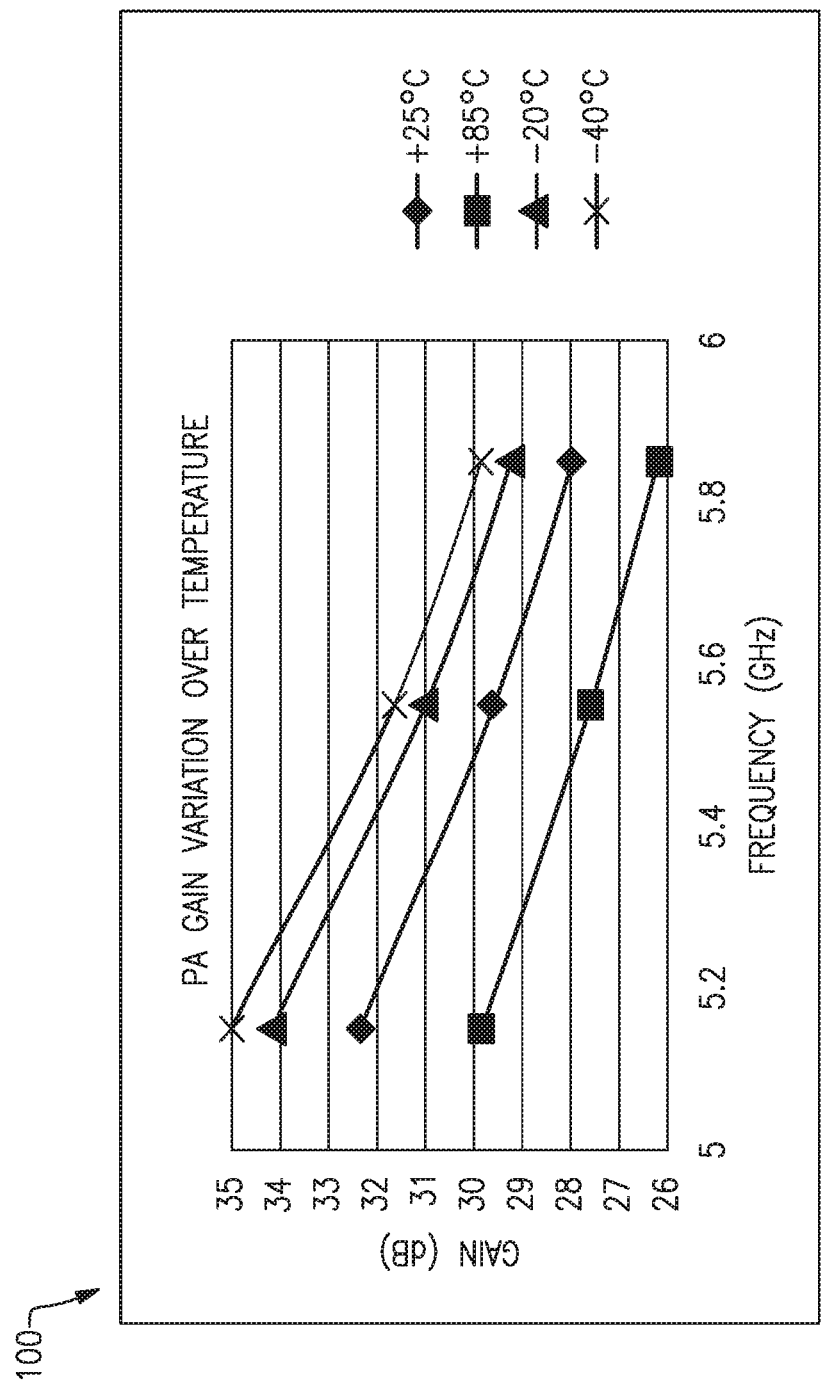
FIG. 3 illustrates gain variation over temperature of an exemplary 5 GHz constant current biased power amplifier.

FIG. 3 shows a performance diagram 100 of gain versus frequency at various temperatures for a 5 GHz constant current biased power amplifier (PA) in accordance with some implementations. As shown in FIG. 3, the gain variation is greatest at the lower end of the band where gain is highest. According to some implementations, the performance diagram 100 shows a gain variation of approximately 4 to 5 dB over temperatures from –40° C. to 85° C.

Typically, there is an approximately 0.4 dB gain droop from the start to the finish of the 4 ms data burst at a 10% duty cycle. In accordance with some implementations, this 0.4 dB gain droop corresponds to a 2.5% EVM over the 4 ms data burst. As such, if the gain droop is reduced by approximately 300%, the static EVM and dynamic EVM will be in satisfactory alignment.

This innovation allows the PA to be biased with the constant current characteristic necessary for low distortion over a wide temperature range. This means that the gain of the PA does fall with increasing ambient temperature. However, the innovation programs a bias increase during the burst with a steep temperature characteristic. This keeps the gain of the PA stable for the duration of the data burst. Since the temperature variation during the data burst is relatively small (e.g., approximately 10° C. change) the percentage bias change is small so the linearity of the PA is not compromised.

A temperature of the power amplifier can be measured, and the temperature information can be used to alter the gain of the power amplifier to compensate for the change in temperature. This can cancel out the gain droop. A bias of a stage of the power amplifier stages can be adjusted to cause the gain to be changed. Alternatively or additionally, a voltage controlled attenuator can be implemented in the gain stage.

Temperature compensation in accordance with the principles and advantages discussed herein can enable a power amplifier system to meet −43 dB EVM levels at room temperature and high temperature. The temperature compensation discussed herein can reduce current consumption and provides better performance relative to some previous DEVM compensation approaches. Compared to some previous approaches, the DEVM compensation discussed herein can improve performance at high temperature without sacrificing room temperature performance.

Figure 4:
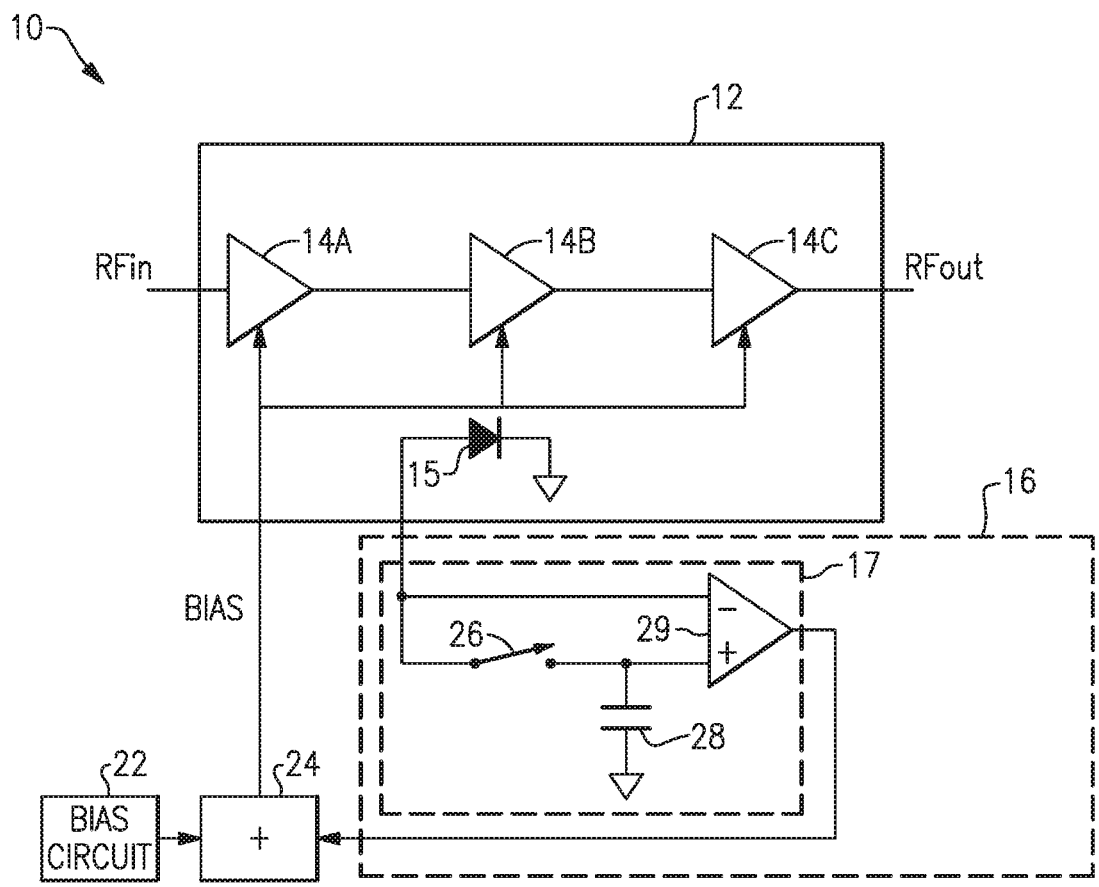
FIG. 4 is a schematic diagram of an illustrative power amplifier system with temperature compensated power amplifier gain, according to certain embodiments.

FIG. 4 is a schematic diagram of an illustrative power amplifier system 10 with temperature compensated power amplifier gain according to an embodiment. The illustrated power amplifier system 10 includes a power amplifier die 12, a temperature compensation circuit 16, a bias circuit 22, and a combining circuit 24.

The power amplifier die 12 includes a power amplifier with power amplifier stages 14A, 14B, and 14C and a temperature sensor 15. The power amplifier die 12 can be a gallium arsenide die, for example. The power amplifier die 12 includes a power amplifier that can have any suitable number of stages. For example, the illustrated power amplifier has three stages. The power amplifier can receive a radio frequency input signal RFin and a bias signal Bias and provided an amplified radio frequency signal RFout. The power amplifier can amplify a wireless local area network (WLNA) signal, such as a Wi-Fi signal. Accordingly, the power amplifier can be a pulsed amplifier. The power amplifier can be arranged to provide bursts of at least 1 ms, for example. The temperature sensor 15 can be a diode functioning as a thermometer, for example. The temperature sensor 15 can provide an indication of temperature to a contact (e.g., a pin or a pad) of the power amplifier die 12. The indication of temperature can be indicative of a change in temperature of the power amplifier. The temperature sensor 15 can be located in an environment with radio frequency signals. Accordingly, an interface of the power amplifier die 12 providing an output from the temperature sensor 15 can be arranged to be substantially immune to radio frequency interference. For instance, the temperature sensor 15 can be a diode connected to the temperature compensation circuit 16 by way of a two wire differential circuit having one wire grounded external to the power amplifier die 12. This can prevent a voltage drop on ground on the power amplifier die 12 from causing an error on a voltage provided by a diode voltage of a diode based temperature sensor 15.

The temperature compensation circuit 16 includes a sampling circuit 17. While the illustrated temperature compensation circuit 16 is external to the power amplifier die 12, a temperature compensation circuit in accordance with any of the principles and advantages discussed herein and a power amplifier can be implemented on a common die in some other instances. The common die can be a silicon-germanium or a silicon die, for example. The sampling circuit 17 can sample a value provided by the temperature sensor 15. The temperature compensation circuit 16 can cause a current of the power amplifier stages 14A, 14B, and/or 14C to be increased as the power amplifier warms up. In other embodiments, the power amplifier can have more or less than three stages.

As illustrated the sampling circuit includes a switch 26, a capacitor 28, and a difference amplifier 29. The switch 26 and the capacitor 28 can function as a sample-and-hold circuit. The switch 26 can be closed in association with the power amplifier being turned on. The capacitor 28 can be charged to a voltage determined by the temperature of the temperature sensor 15 while the switch 26 is closed. The switch 26 can be open a relatively short amount of time (e.g., a few microseconds such as about 3 us) after the power amplifier is turned on. This can capture an indication of temperature after the power amplifier has initially stabilized. For example, the indication of temperature can be captured during the third phase $\Phi_3$ of FIG. 2. The capacitor 28 can retain its charge for the remainder of the burst. The sample-and-hold circuit can be reset between bursts.

As the temperature of the power amplifier warms up, the voltage of the temperature sensor 15 can decrease. If the voltage of the temperature sensor 15 drops, indicating that the power amplifier has warmed up, after its value is sampled by the sampling circuit 17, there will be a non-zero reference voltage provided by the difference amplifier 29. The output of the difference amplifier 29 can be an indication of instantaneous temperature change of the power amplifier. The output of the difference amplifier 29 is the output of the sampling circuit 17 in FIG. 4.

The bias circuit 22 can generate a bias signal for the power amplifier. The combining circuit 24 can combine (e.g., add) an output of the bias signal with the compensation signal to generate a bias signal Bias for the power amplifier. The bias signal Bias can be provided to the stages 14A, 14B, 14C of the power amplifier as illustrated. A bias signal for any suitable power amplifier stage can be adjusted in accordance with any of the principles and advantages discussed herein. In some applications, bias signals for two or more stages can be adjusted in accordance with any of the principles and advantages discussed herein. In another embodiment, the bias signal Bias can be provided to the first stage 14A of the power amplifier. In another embodiment, the bias signal Bias can be provided to the second and third stages 14B, 14C of the power amplifier, and not to the first stage 14A of the power amplifier. In other embodiments, the bias signal Bias can be provided to one or more or any combination of the stages of the power amplifier. In a further embodiment, the bias signal Bias can be provided to a variable attenuator.

In some embodiments, the temperature compensation circuit 16, the bias circuit 22, and the combining circuit 24 can be implemented on a common die. The common die can be a silicon die. The common die can be a complementary semiconductor metal oxide die. According to some other embodiments, any suitable portion of the temperature compensation circuit 16, the bias circuit 22, and/or the combining circuit 24 can be implemented on a common die. In the preferred embodiment, a current mirror is implemented on the PA die (12), and the temperature sensor (15) is implemented on the PA die, and the rest of the bias circuit that generates the current for the current mirror is implemented on the CMOS die.

Long word gain compensation can account for gain drop caused by the entire power amplifier warming up during relatively long bursts (e.g., bursts of at least 1 ms). The power amplifier temperature can be monitored by a temperature sensor, such as the temperature sensor 15 of FIG. 4. The temperature sensor 15 can be a diode on a gallium arsenide die acting as a thermometer, for example. Long word gain compensation can advantageously compensate for gain droop for bursts of 1 ms to 5 ms long.

A bias current provided to the first stage of a power amplifier can be represented by Equation 1:

$$I_{OB1}=I_O(1+k_T(V_{d0}-V_d)) \qquad \text{(Equation 1)}$$

In Equation 1, $I_{OB1}$ can represent a bias current for a first stage of a power amplifier (e.g., current provided to the power amplifier stages 14A, 14B, and/or 14C in FIG. 4), $I_O$ can represent a starting current, $k_T$ can represent a temperature coefficient, $V_{d0}$ can represent a diode voltage at a beginning of a burst (e.g., a voltage from the temperature sensor 15 held on the capacitor 28 in FIG. 4), and $V_d$ can represent a diode voltage (e.g., a voltage from the temperature sensor 15 provided to the inverting terminal of the difference amplifier 29 in FIG. 4). In Equation 1, the term $V_{d0}-V_d$ can be replaced by 0 if $V_{d0}-V_d$ is negative so as to not decrease the bias current.

Measurements indicate that the gain can drop can be in a range from about 0.2 dB to 0.4 dB over a relatively long burst. A change of 10-15% in bias current for a first power amplifier stage can cause approximately 0.3 dB change in power amplifier gain. A temperature sensor that includes two diodes in series can measure about 15 mV of voltage change on the diodes. The voltage change can be expected to change by less than about 10 mV in certain applications. A voltage change of about 7.5 mV can result in about 7% change in current for the first power amplifier stage. As an example, $k_T$ can be about 1% per mV.

While FIG. 4 illustrates an example power amplifier system 10 that can implement temperature compensated power amplifier biasing in accordance with Equation 1, any suitable circuit arranged to implement Equation 1 or a similar equation can alternatively be implemented. Such a circuit can be implemented with analog circuits, digital circuits, or any suitable combination thereof.

Figure 5:
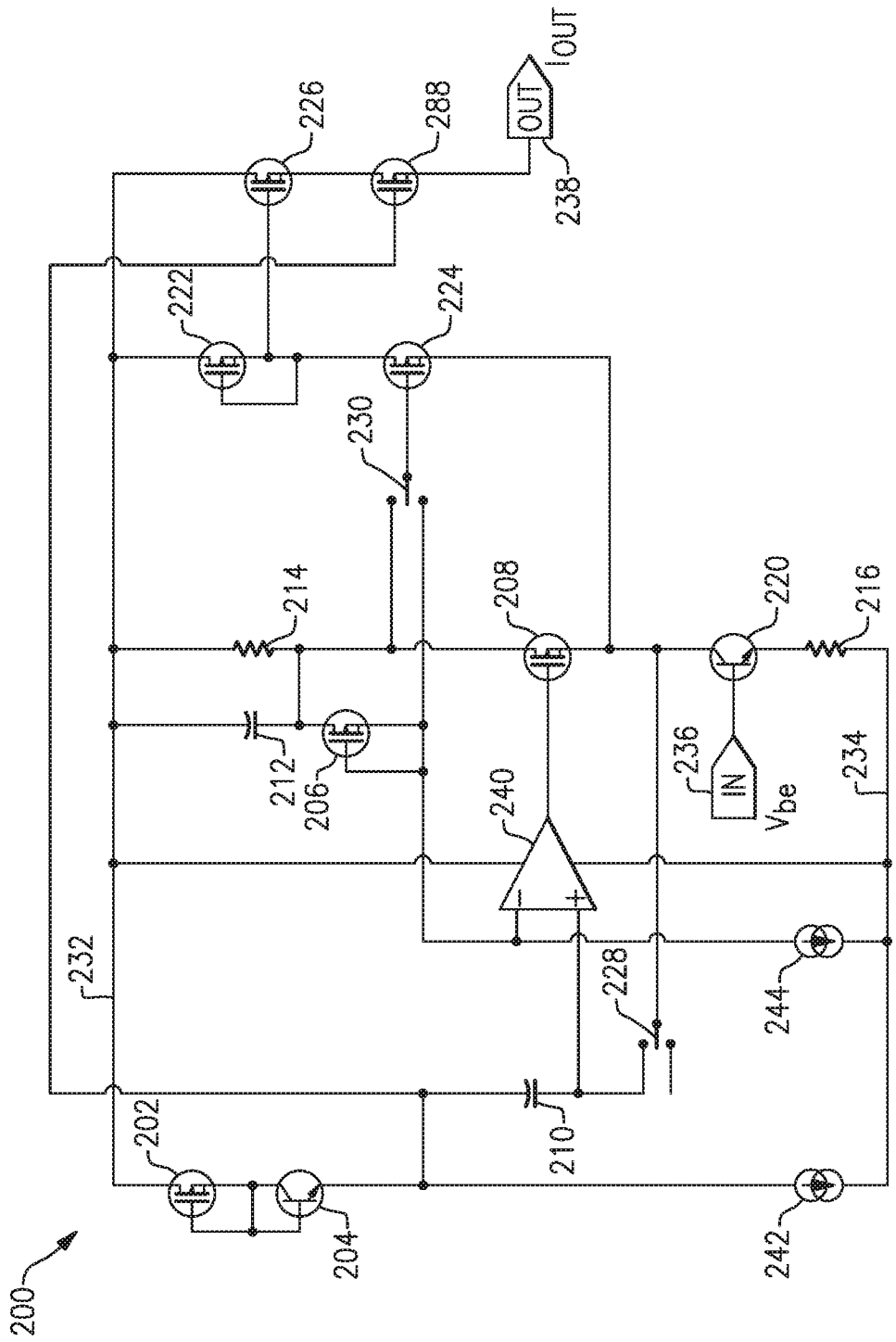
FIG. 5 illustrates a schematic diagram of an exemplary sample and hold bias circuit, according to certain embodiments.

FIG. 5 is a schematic diagram of a bias circuit 200 in accordance with some implementations. While pertinent features are shown, those of ordinary skill in the art will appreciate from the disclosure herein that various other features have not been illustrated for the sake of brevity and so as not to obscure more pertinent aspects of the example implementations disclosed herein. To that end, in some implementations, the bias circuit 200 includes: p-channel field effect transistors (PFETs) 202, 206, 208, 222, 226, and 288; an n-channel field effect transistor (NFET) 224; and NPN bipolar junction transistors (BJTs) 204 and 220. According to some implementations, transistors 202, 206, 208, 222, 224, 226, and 288 are FETS, metal-oxide semiconductor FETS (MOSFETS) (e.g., internally or externally connected), inductive channel MOSFETS, or the like. In some implementations, the bias circuit 200, as shown in FIG. 5, also includes: a storage capacitor 210; a capacitor 212; and resistors 214 and 216.

According to some implementations, the bias circuit 200, as shown in FIG. 5, further includes: single-pole-double-throw (SPDT) switches 228 and 230; and difference amplifier 240. In an embodiment, the difference amplifier 240 is an operational amplifier. As shown in FIG. 5, the SPDT switches 228 and 230 are in a neutral state (e.g., the pole is connected to neither of the two throws).

As shown in FIG. 5, the pole of the SPDT switch 228 is connected to the drain of PFET 208 and the source of NPN BJT 220. A first throw of the SPDT switch 228 is connected to the storage capacitor 210, and a second throw of the SPDT switch 228 is connected to ground.

As shown in FIG. 5, the pole of the SPDT switch 230 is connected to the gate of the NFET 224. A first throw of the SPDT switch 230 is connected to the capacitor 212 and the resistor 214, and a second throw of the SPDT switch 230 is connected to the gate and source of the PFET 206.

As shown in FIG. 5, the positive input terminal of the amplifier 240 is connected to the storage capacitor 210. As shown in FIG. 5, the negative input terminal of the op amp 240 is connected to the negative voltage rail 234 through current source 244, the gate and source of PFET 206, and a throw of SPDT switch 230.

In accordance with some implementations, as shown in FIG. 5, the bias circuit 200 further includes: a positive voltage rail 232; a negative voltage rail 234; input (Vbe) 236 connected to the gate of NPN BJT 220; an output (Iout) 238 connected to the drain of PFET 288; and current sources 242 and 244.

Figure 6A:
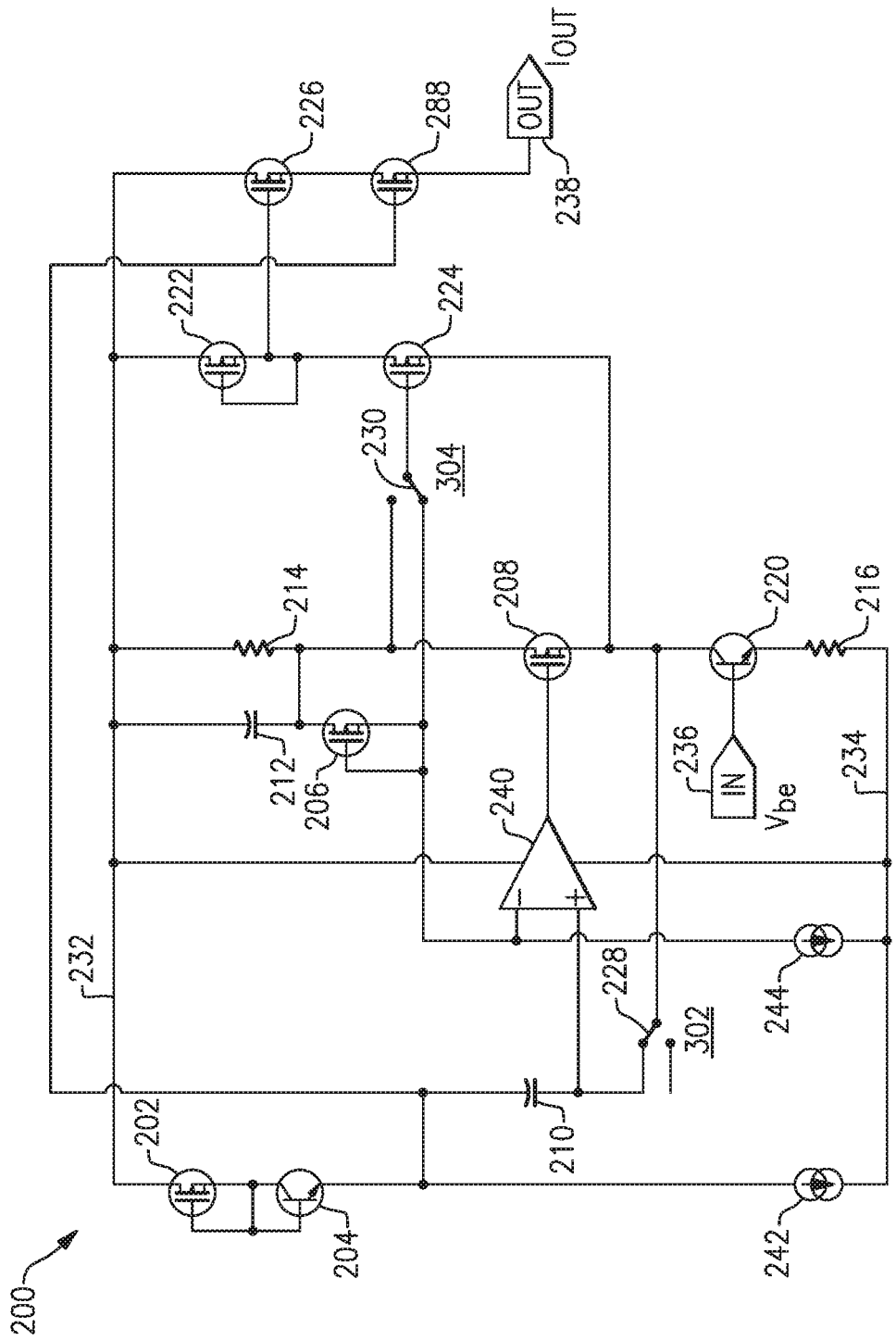
FIG. 6A illustrates a schematic diagram of the exemplary sample and hold bias circuit of FIG. 5 in the sample mode, according to certain embodiments.

FIG. 6A is a schematic diagram of the bias circuit 200 in FIG. 5 in a first mode (e.g., sample mode) in accordance with some implementations. In FIG. 6A, the elements of the bias circuit 200 are similar to and adapted from those discussed above with reference to FIG. 5. Elements common to FIGS. 5 and 6A include common reference numbers, and only the differences between FIGS. 5 and 6A are described herein for the sake of brevity. According to some implementations, the SPDT switch 228 is in a state 302 whereby its pole is connected to the storage capacitor 210, and the SPDT switch 230 is in a state 304 whereby its pole is connected to the negative input terminal of the op amp 240 and the gate and drain of PFET 206. In other words, according to some implementations, the first mode of the bias circuit 200 includes the SPDT switch 228 in the state 302 and the SPDT switch 230 in the state 304.

In some implementations, the first mode of the bias circuit 200 lasts for a few microseconds at the start of a data burst (e.g., 2 µs). In some implementations, in the first mode, the amplifier 240 sets the voltage on the drain of PFET 208 equal to the voltage on the negative input terminal of the op amp 240. In accordance with some implementations, in the first mode, the PFET 208 tracks the current in NPN BJT 220. In accordance with some implementations, in the first mode, the storage capacitor 210 charges and the output (Iout) 238 is approximately 0 amps.

Figure 6B:
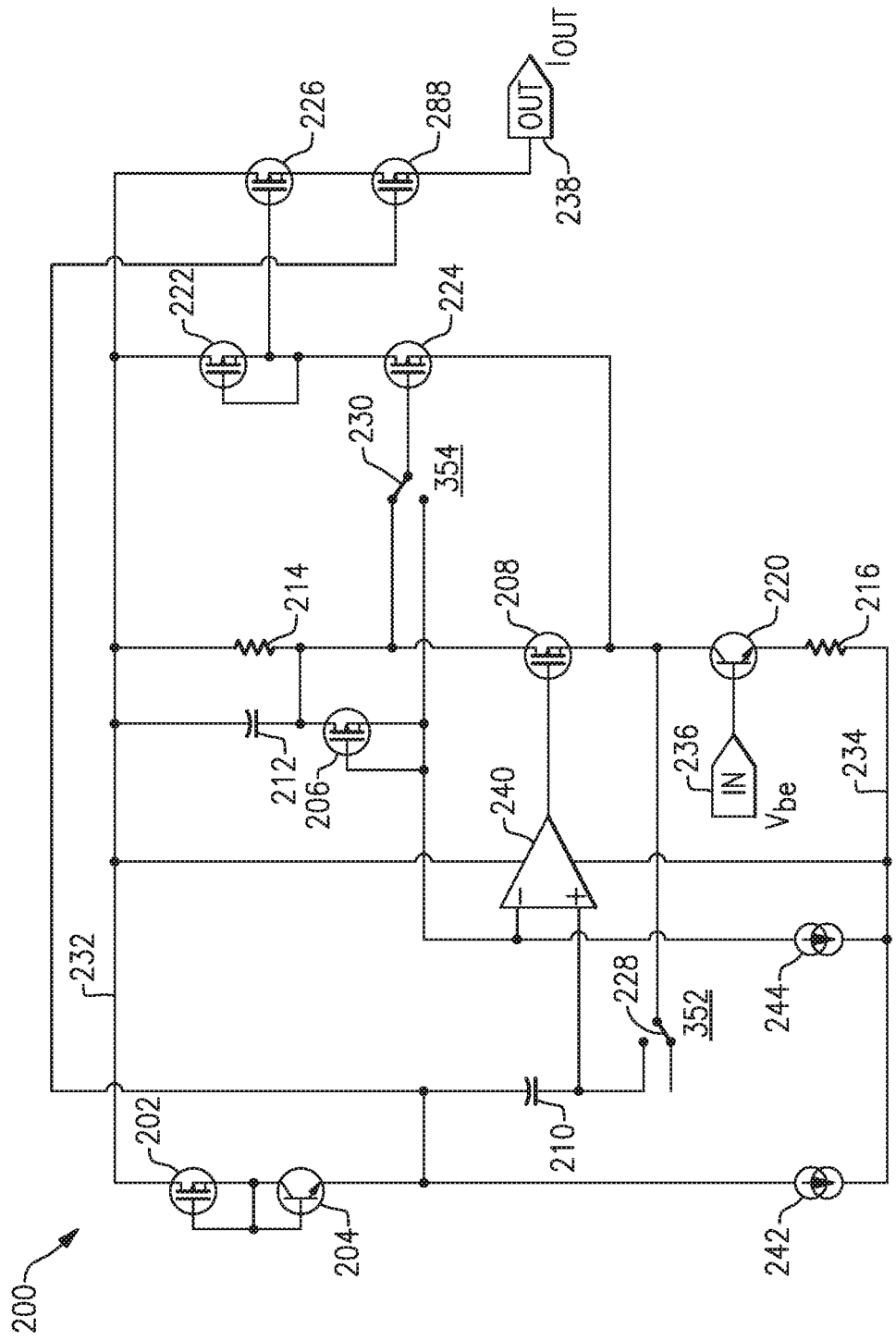
FIG. 6B illustrates a schematic diagram of the exemplary sample and hold bias circuit of FIG. 5 in the hold mode, according to certain embodiments.

FIG. 6B is a schematic diagram of the bias circuit 200 in FIG. 5 in a second mode (e.g., hold mode) in accordance with some implementations. In FIG. 6B, the elements of the bias circuit 200 are similar to and adapted from those discussed above with reference to FIG. 5. Elements common to FIGS. 5 and 6B include common reference numbers, and only the differences between FIGS. 5 and 6B are described herein for the sake of brevity. According to some implementations, the SPDT switch 228 is in a state 352 whereby its pole is connected to ground, and the SPDT switch 230 is in a state 354 whereby its pole is connected to the drain of PFET 208, the source of PFET 206, the capacitor 212, and the resistor 214. In other words, according to some implementations, the second mode of the bias circuit 200 includes the SPDT switch 228 in the state 352 and the SPDT switch 230 in the state 354.

In some implementations, the second mode of the bias circuit 200 lasts from the end of the first mode, which lasts for the initial few microseconds of the data burst, to the end of the data burst. In some implementations, in the second mode, the op amp 240 sets the voltage on its negative input terminal equal to the voltage on its positive input terminal.

According to some implementations, in the second mode, the current in PFET 208 is held at its final value from the first mode but with a negative temperature coefficient. In accordance with some implementations, as the PA warms the PTAT current in NPN BJT 220 rises and the current in PFET 208 decreases. According to some implementations, in the second mode, a difference current flows through NFET 224. For example, the difference current is initially approximately 0 amps, but the difference current increases as the PA warms. In accordance with some implementations, the difference current is mirrored to provide the output current (Iout) 238, which is in turn added to the bias circuit of the PA (e.g., the bias circuit 610 in FIGS. 9A-9C, 10, and 11). In other words, the excess current from NPN BJT 220 flows in NFET 224 and through to the output (Iout) 238.

Figure 7:
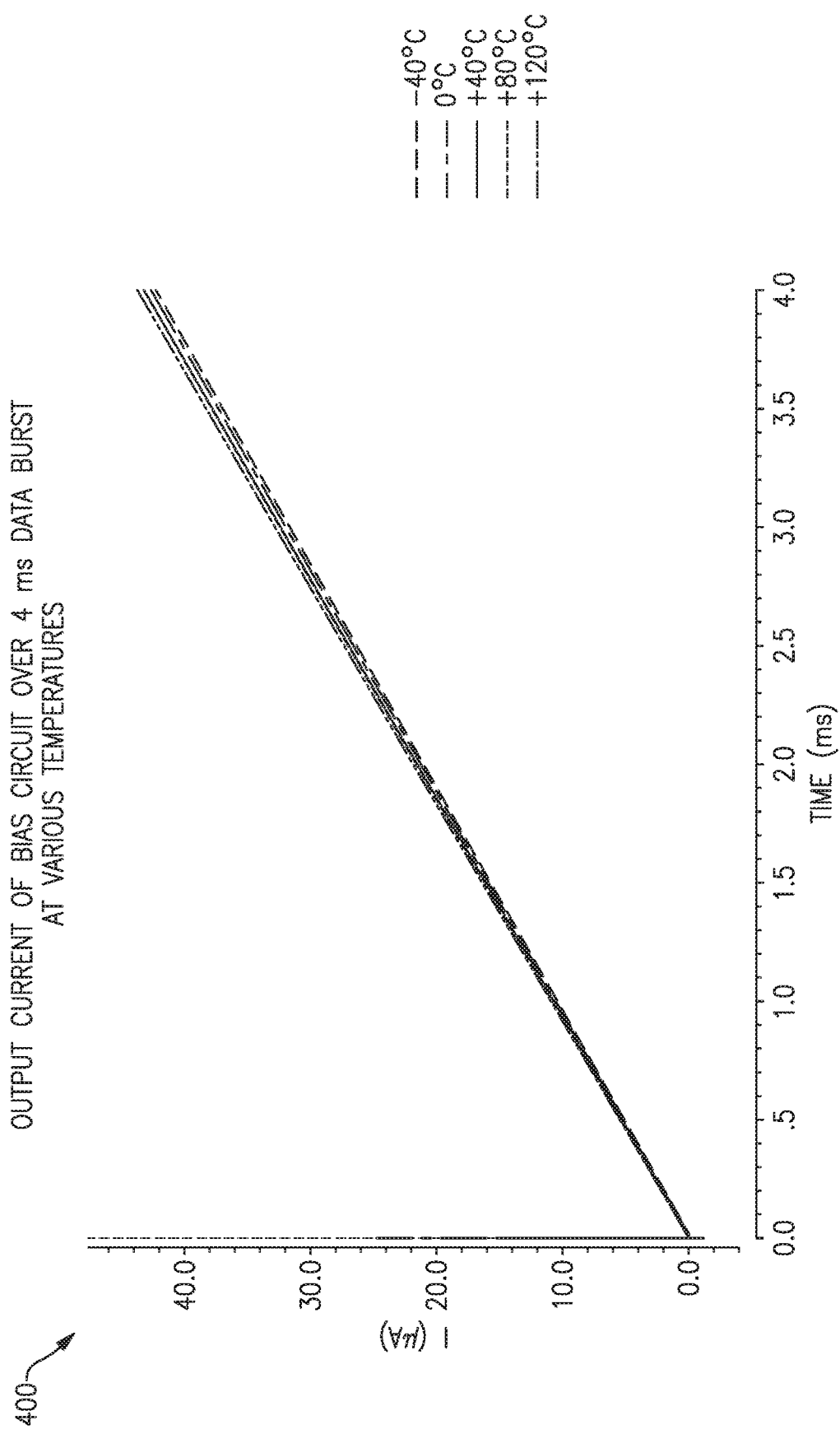
FIG. 7 illustrates the output current of an exemplary bias circuit over a 4 ms data burst at various PA start temperatures, according to certain embodiments.

FIG. 7 is a performance diagram 400 of the bias circuit 200 in FIG. 5 in accordance with some implementations. The performance diagram 400 shows the output current of the circuit (e.g., the output (Iout) 238) when subjected to an approximately 10° C. rise during the data burst. For example, temperatures from −40 to 120° C. have been used in the simulation as the PA temperature at the start of the burst. The various plots in the performance diagram 400 signify the different start temperatures.

According to some implementations, the duration of the "spike" on all the traces at the start of the burst is sufficiently short to be filtered by subsequent circuitry. Regardless of temperature at the start of the burst the correction current at the start of the burst is approximately 0 amps. All plots have very similar gradient so the correction current generated is essentially independent of the ambient temperature of the PA at the start of the burst.

Figure 8:
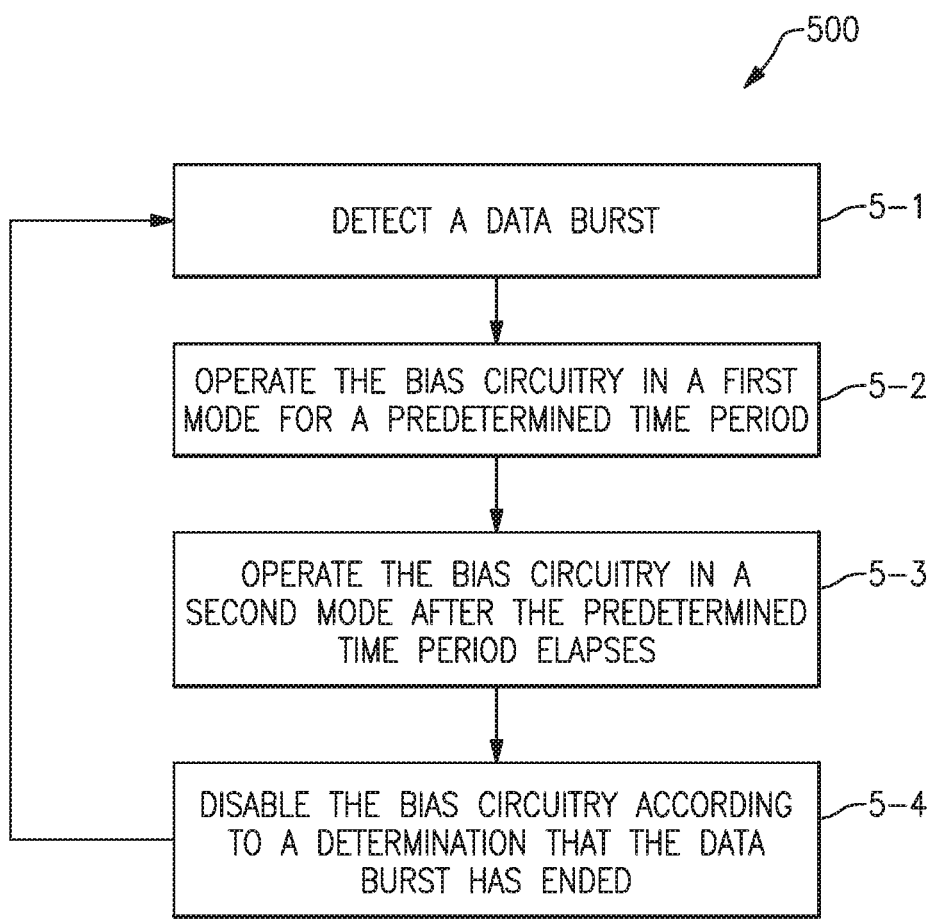
FIG. 8 is an exemplary flowchart illustrating a method of operating bias circuitry during a data burst, according to certain embodiments.

FIG. 8 is a flowchart representation of a method 500 of operation during a data burst in accordance with some implementations. In some implementations, the method 500 is performed by the bias circuit 200 or a controller associated therewith. In some implementations, the method 500 is performed by a CMOS (complementary metal-oxide semiconductor) controller (e.g., when a GaAs power amplifier (PA) is used). While pertinent features are shown, those of ordinary skill in the art will appreciate from the disclosure herein that various other features have not been illustrated for the sake of brevity and so as not to obscure more pertinent aspects of the example implementations disclosed herein. To that end, briefly, in some circumstances, the method 500 includes: detecting a data burst; operating the bias circuitry in a first mode for a predetermined time period after detecting the data burst; operating the bias circuitry in a second mode after the predetermined time period elapses; and disabling the bias circuitry according to a determination that the data burst has ended.

To that end, as represented by block 5-1, the method 500 includes detecting a data burst. For example, with reference to FIG. 11, the bias circuit 200 or a controller associated therewith detects the initiation of a quadrature amplitude modulation (QAM) data burst by the transceiver 810.

As represented by block 5-2, the method 500 includes operating the bias circuitry in a first mode for a predetermined time period after detecting the data burst. For example, with reference to FIG. 6A, the bias circuit 200 or a controller associated therewith operates the bias circuit 200 according to the first mode (e.g., sample mode) by setting the SPDT switch 228 in the state 302 and the SPDT switch 230 in the state 304.

As represented by block 5-3, the method 500 includes operating the bias circuitry in a second mode after the predetermined time period elapses. For example, with reference to FIG. 6B, the bias circuit 200 or a controller associated therewith operates the bias circuit 200 according to the second mode (e.g., hold mode) by setting the SPDT switch 228 in the state 352 and the SPDT switch 230 in the state 354.

As represented by block 5-4, the method 500 includes disabling the bias circuitry according to a determination that the data burst has ended. For example, with reference to FIG. 11, the bias circuit 200 or a controller associated therewith disables the bias circuit 200 according to a determination that the transceiver 810 has ended the data burst. In one example, the bias circuit 200 is disabled by setting the SPDT switches 228 and 230 to the neutral state shown in FIG. 5. In another example, the bias circuit 200 is disabled by setting the SPDT switches 228 and 230 to the first mode shown in FIG. 6A (e.g., the output current (Iout) 238 is approximately 0 amps).

According to some implementations, the bias circuit 200 or a controller associated therewith waits until a subsequent data burst is detected at block 5-1 before repeating blocks 5-2 through 5-4.

Figure 9A:
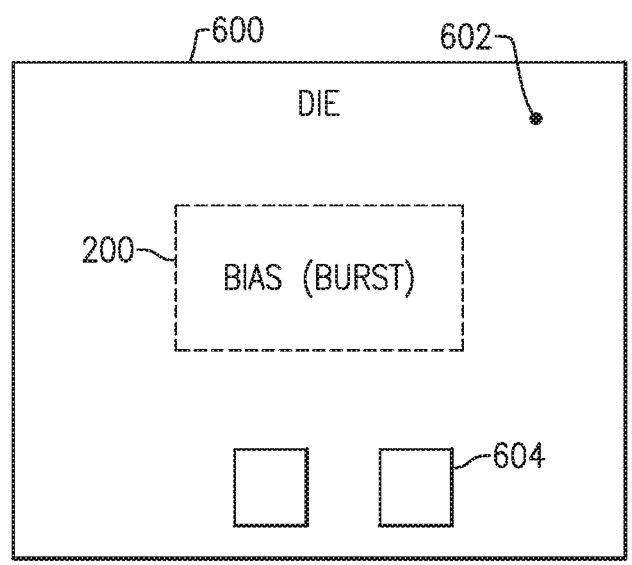
FIGS. 9A-9C are block diagrams of exemplary integrated circuits that include a bias circuit that provides bias control during data bursts, according to certain embodiments.
Figure 9B:
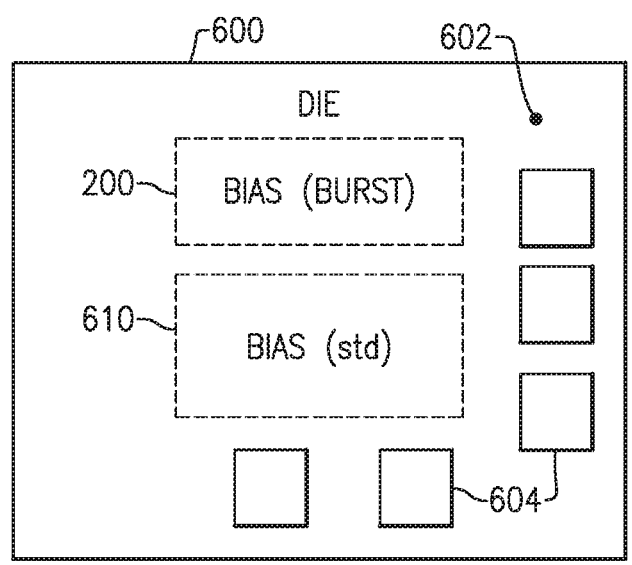
Figure 9C:
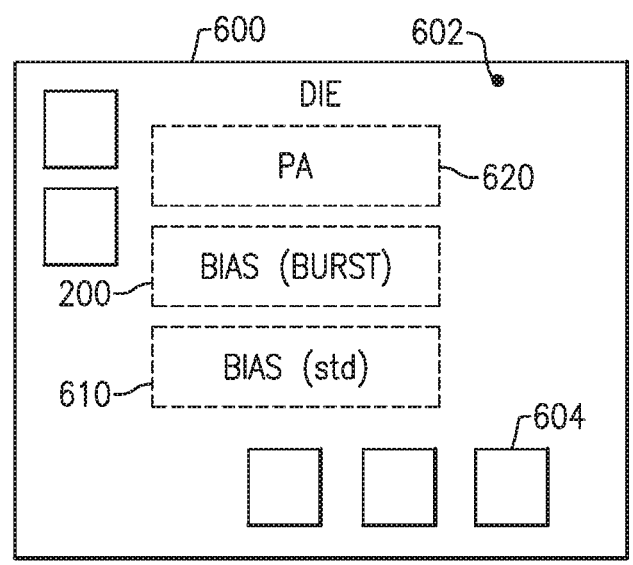

FIGS. 9A-9C are block diagrams of various integrated circuits (ICs) according to some implementations. While some example features are illustrated, those skilled in the art will appreciate from the disclosure herein that various other features have not been illustrated for the sake of brevity and so as not to obscure more pertinent aspects of the example implementations disclosed herein. To that end, for example, FIG. 9A shows that in some implementations, some or all portions of the bias circuit 200, which operates during data bursts, can be part of a semiconductor die 600. By way of an example, the bias circuit 200 can be formed on a substrate 602 of the die 600. A plurality of connection pads 604 can also be formed on the substrate 602 to facilitate functionalities associated with some or all portions of the bias circuit 200.

FIG. 9B shows that in some implementations, a semiconductor die 600 having a substrate 602 can include some or all portions of the bias circuit 200 and some or all portions of the bias circuit 610, which operates during normal operations according to conventional power amplifier (PA) biasing techniques. A plurality of connection pads 604 can also be formed on the substrate 602 to facilitate functionalities associated with some or all portions of the bias circuit 200 and some or all portions of the bias circuit 610.

FIG. 9C shows that in some implementations, a semiconductor die 600 having a substrate 602 can include some or all portions of the bias circuit 200, some or all portions of the bias circuit 610, and some or all portions of the power amplifier (PA) 620. A plurality of connection pads 604 can also be formed on the substrate 602 to facilitate functionalities associated with some or all portions of the bias circuit 200, some or all portions of the bias circuit 610, and some or all portions of the PA 620. In an embodiment, die 600 is a SiGe die integrating the PA 620 and a controller that includes bias circuit 200 and bias circuit 610.

Figure 10:
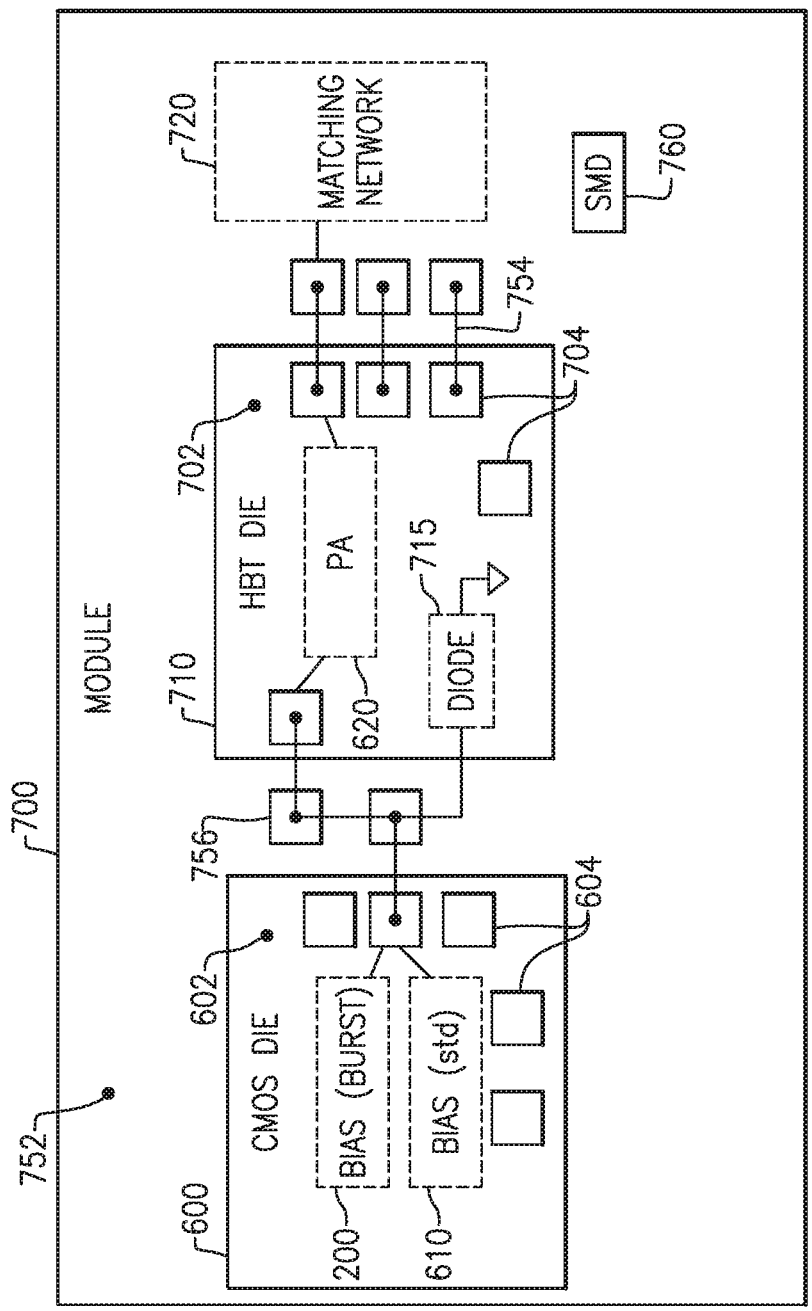
FIG. 10 is an exemplary schematic block diagram of a module that includes a bias circuit that provides bias control during data bursts, according to certain embodiments.

In some implementations, one or more features described herein can be included in a module. FIG. 10 is a schematic diagram of an implementation of a module 700 including the bias circuit in FIG. 5 according to some implementations. While some example features are illustrated, those skilled in the art will appreciate from the disclosure herein that various other features have not been illustrated for the sake of brevity and so as not to obscure more pertinent aspects of the example implementations disclosed herein. The module 700 includes a packaging substrate 752, connection pads 756, a CMOS (complementary metal-oxide semiconductor) die 600, a HBT (heterojunction bipolar transistor) die 710, a matching network 720, and one or more surface mount devices 760.

The CMOS die 600 includes a substrate 602 including some or all portions of the bias circuit 200 and some or all portions of the bias circuit 610. A plurality of connection pads 604 is formed on the substrate 602 to facilitate functionalities associated with some or all portions of the bias circuit 200 and some or all portions of the bias circuit 610. Similarly, the HBT die 710 includes a substrate 702 including some or all portions of the PA 620. The HBT die 710 also includes a plurality of connection pads 704 formed on the substrate 702 to facilitate functionalities associated with some or all portions of the PA 620 and diode 715.

The connection pads 756 on the packaging substrate 752 facilitate electrical connections to and from each of the CMOS die 600 and the HBT die 710. For example, the connection pads 756 facilitate the use of wirebonds 754 for passing various signals and supply currents and/or voltages to each of the CMOS die 600 and the HBT die 710.

In some implementations, the components mounted on the packaging substrate 752 or formed on or in the packaging substrate 752 can further include, for example, one or more surface mount devices (SMDs) (e.g., 760) and one or more matching networks (e.g., 720). In some implementations, the packaging substrate 752 can include a laminate substrate.

In some implementations, the module 700 can also include one or more packaging structures to, for example, provide protection and facilitate easier handling of the module 700. Such a packaging structure can include an overmold formed over the packaging substrate 752 and dimensioned to substantially encapsulate the various circuits and components thereon.

It will be understood that although the module 700 is described in the context of wirebond-based electrical connections, one or more features disclosed herein can also be implemented in other packaging configurations, including flip-chip configurations.

Figure 11:
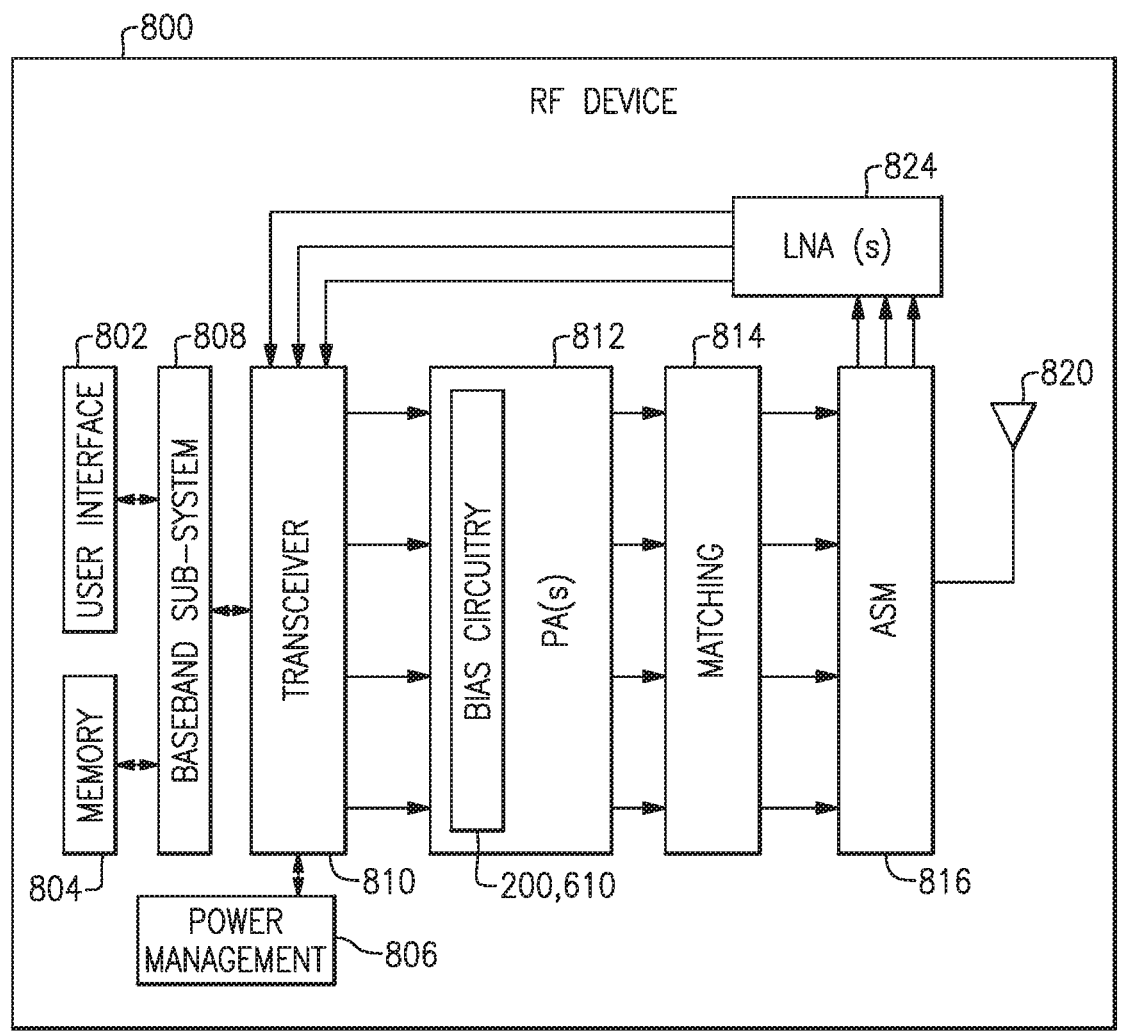
FIG. 11 is an exemplary schematic block diagram of a radio frequency (RF) device that includes a bias circuit that provides bias control during data bursts, according to certain embodiments.

FIG. 11 schematically depicts an example radio-frequency (RF) device 800 having one or more advantageous features described herein. While pertinent features are shown, those of ordinary skill in the art will appreciate from the disclosure herein that various other features have not been illustrated for the sake of brevity and so as not to obscure more pertinent aspects of the example implementations disclosed herein. To that end, in some implementations, the RF device 800 is a wireless device. In some implementations, such a wireless device can include, for example, a cellular phone, a smart-phone, a hand-held wireless device with or without phone functionality, a wireless tablet, a wireless router, a wireless access point, a wireless base station, or the like.

In some implementations the RF device 800 includes one or more power amplifier (PAs) (e.g., the PA 620 in FIGS. 9C and 10) in a PA module 812 configured to receive their respective RF signals from a transceiver 810 that can be configured and operated in known manners to generate RF signals to be amplified and transmitted, and to process received signals. In some implementations, the PA module 812 can include one or more filters and/or one or more band/mode selection switches configured to provide duplexing and/or switching functionalities as described herein. According to some implementations, the PA module 812 includes the bias circuit 200, which operates during data bursts as described with reference to FIGS. 5 and 6A-6B, and/or the bias circuit 610, which operates during normal operations according conventional PA biasing techniques.

The transceiver 810 is shown to interact with a baseband sub-system 808 that is configured to provide conversion between data and/or voice signals suitable for a user and RF signals suitable for the transceiver 810. The transceiver 810 is also shown to be connected to a power management component 806 that is configured to manage power for the operation of the RF device 800. In some implementations, the power management component 806 can also control operations of the baseband sub-system 808 and other components of the RF device 800.

The baseband sub-system 808 is shown to be connected to a user interface 802 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

In some implementations, a matching network 814 is provided between the PA module 812 and the antenna switch module (ASM) 816. In some implementations, the ASM 816 is connected to an antenna 820 and is configured to control which signals are transmitted via the antenna 820.

As shown in FIG. 11, some received signals via the antenna 820 are shown to be routed from the ASM 816 to one or more low-noise amplifiers (LNAs) 824. Amplified signals from the one or more LNAs 824 are shown to be routed to the transceiver 810.

A number of other wireless device configurations can utilize one or more features described herein. For example, the RF device 800 does not need to be a multi-band device. In another example, the RF device 800 can include additional antennas such as diversity antenna, and additional connectivity features such as Cellular or LTE functionality, Bluetooth, and GPS.

According to some implementations, when the PA module 812 includes one or more GaAs PAs, the bias circuit 200 is replaced by a CMOS controller which performs the functions described with respect to FIGS. 5, 6A-6B, and 8.

For example, the CMOS controller senses PA die temperature by monitoring the Vbe of a diode on the PA die. In some implementations, the CMOS controller samples Vbe at start of burst and holds the value. According to some implementations, the CMOS controller then develops a control current proportional to the change in Vbe relative to the start of the burst. The CMOS controller uses this control current to increase the bias of second and third stages of the PA so as to restore the PA gain to its value at the start of the burst. The CMOS controller also gives better bias control over temperature and voltage further enhancing GaAs PA performance. In some implementations, the CMOS controller is co-packaged with the GaAs PA to allow easy bond wire interconnect between the die associated with the CMOS controller and the die associated with the GaAs PA.

Terminology

Some of the embodiments described above have provided examples in connection with mobile phones. However, the principles and advantages of the embodiments can be used for any other systems or apparatus that have needs for power amplifier systems.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a PC card, a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
    a power amplifier configured to amplify a radio frequency signal;
    a temperature sensor configured to measure a temperature of the power amplifier, the power amplifier and the temperature sensor implemented on a first semiconductor die; and
    a sampling circuit configured to sample an indication of the temperature of the power amplifier for a first time interval after a data burst of the radio frequency signal is detected, the sampling circuit implemented on a second semiconductor die.

2. The power amplifier system of claim 1 wherein the first semiconductor die is a gallium arsenide die and the second semiconductor die is a complementary metal-oxide die.

3. The power amplifier system of claim 1 further comprising a bias circuit configured to generate a bias compensation signal based on a change in the temperature of the power amplifier during the data burst and a temperature coefficient.

4. The power amplifier system of claim 3 wherein the bias compensation signal is applied to the power amplifier to adjust a gain of the power amplifier.

5. The power amplifier system of claim 3 further comprising a coefficient register configured to provide the temperature coefficient.

6. The power amplifier circuit of claim 3 further comprising a scaling circuit configured to multiply an indication of the change in the temperature of the power amplifier by the temperature coefficient to generate the bias compensation signal.

7. The power amplifier system of claim 3 wherein the change in the temperature of the power amplifier occurs during a second time interval of the data burst that begins after the first time interval ends.

8. The power amplifier system of claim 3 wherein a current of the bias circuit increases as the temperature of the power amplifier increases during the data burst.

9. The power amplifier system of claim 1 wherein the data burst is between and including 1 millisecond and 5 milliseconds.

10. A method to adjust a gain of a power amplifier, the method comprising:
    implementing a temperature sensor and a power amplifier configured to amplify a radio frequency signal on a first semiconductor die, and a sampling circuit on a second semiconductor die;

measuring with the temperature sensor a temperature of the power amplifier during a data burst of the radio frequency signal; and sampling with the sampling circuit an indication of the temperature of the power amplifier for a time interval after the data burst is detected.

11. The method of claim 10 wherein the first semiconductor die is a gallium arsenide die and the second semiconductor die is a complementary metal-oxide die.

12. The method of claim 10 further comprising generating a bias compensation signal based on a change in the indication of the temperature of the power amplifier during the data burst and a temperature coefficient.

13. The method of claim 12 further comprising adjusting a gain of the power amplifier based on the bias compensation signal.

14. The method of claim 12 further comprising disabling circuitry generating the bias compensation signal when the data burst has ended.

15. The method of claim 10 wherein the data burst is less than 1 millisecond.

16. A wireless communication device comprising:
a power amplifier configured to amplify a radio frequency signal;
an antenna configured to transmit the amplified radio frequency signal;
a temperature sensor configured to measure a temperature of the power amplifier, the power amplifier and the temperature sensor implemented on a first semiconductor die; and
a sampling circuit configured to sample an indication of the temperature of the power amplifier for a time interval after a data burst of the radio frequency signal is detected, the sampling circuit implemented on a second semiconductor die.

17. The wireless communication device of claim 16 wherein the first semiconductor die is a gallium arsenide die and the second semiconductor die is a complementary metal-oxide die.

18. The wireless communication device of claim 16 further comprising a bias circuit configured to generate a bias compensation signal based on a change in the indication of the temperature of the power amplifier during the data burst and a temperature coefficient.

19. The wireless communication device of claim 18 wherein the bias compensation signal is applied to the power amplifier to adjust a gain of the power amplifier.

20. The wireless communication device of claim 16 wherein the data burst is greater than 5 milliseconds.

* * * * *